United States Patent
Yoshida

(10) Patent No.: US 11,475,963 B2
(45) Date of Patent: Oct. 18, 2022

(54) SEMICONDUCTOR MEMORY WITH DATA PROTECTION FUNCTION AND DATA PROTECTION METHOD THEREOF

(71) Applicant: Powerchip Semiconductor Manufacturing Corporation, Hsinchu (TW)

(72) Inventor: Munehiro Yoshida, Kanagawa (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 20 days.

(21) Appl. No.: 17/206,141

(22) Filed: Mar. 19, 2021

(65) Prior Publication Data

US 2022/0301641 A1    Sep. 22, 2022

(51) Int. Cl.
  *G11C 16/04* (2006.01)
  *G11C 16/34* (2006.01)
  *G11C 16/30* (2006.01)
  *G11C 16/10* (2006.01)

(52) U.S. Cl.
  CPC ...... *G11C 16/3427* (2013.01); *G11C 16/0483* (2013.01); *G11C 16/10* (2013.01); *G11C 16/30* (2013.01)

(58) Field of Classification Search
  CPC . G11C 16/3427; G11C 16/0483; G11C 16/10; G11C 16/30
  USPC ...................................................... 365/185.02
  See application file for complete search history.

(56) References Cited

U.S. PATENT DOCUMENTS

| | | | | |
|---|---|---|---|---|
| 5,357,458 A | * | 10/1994 | Yu .......................... | G11C 5/143 365/49.1 |
| 5,420,798 A | * | 5/1995 | Lin .......................... | G05F 3/24 365/189.09 |
| 5,592,420 A | * | 1/1997 | Cernea .................... | G11C 16/16 365/189.09 |
| 7,085,162 B2 | | 8/2006 | Nakamura et al. | |

(Continued)

FOREIGN PATENT DOCUMENTS

| | | |
|---|---|---|
| CN | 102831931 | 12/2012 |
| JP | 2001256790 | 9/2001 |

(Continued)

OTHER PUBLICATIONS

"Office Action of Taiwan Counterpart Application", dated Aug. 30, 2021, p. 1-p. 5.

*Primary Examiner* — Tha-O H Bui
(74) *Attorney, Agent, or Firm* — JCIPRNET

(57) ABSTRACT

A semiconductor memory and a data protection method are provided. The semiconductor memory includes a memory array, a switch circuit, a control circuit and a power-down monitor circuit. The switch circuit is coupled to the memory array. The control circuit is coupled to the switch circuit. The power-down monitor circuit is coupled to the control circuit and a supply voltage. The power-down monitor circuit is configured to determine whether that the supply voltage drops below a first power-down detect level during a programming period, to output a trigger signal to the control circuit. The control circuit executes a reset sequence of the semiconductor memory according to the trigger signal. The first power-down detect level is lower than a minimum value of the supply voltage recorded in a datasheet of the semiconductor memory.

20 Claims, 5 Drawing Sheets

(56) References Cited

U.S. PATENT DOCUMENTS

| | | | |
|---|---|---|---|
| 7,733,712 B1* | 6/2010 | Walston | G11C 5/143 |
| | | | 365/189.11 |
| 9,129,665 B2* | 9/2015 | Lucas | G11C 5/147 |
| 9,478,271 B2 | 10/2016 | Chen et al. | |
| 10,719,402 B2 | 7/2020 | Alcorn et al. | |
| 2015/0364204 A1 | 12/2015 | Kim et al. | |
| 2017/0091042 A1 | 3/2017 | Chou et al. | |
| 2020/0035299 A1 | 1/2020 | Lien et al. | |
| 2020/0042466 A1 | 2/2020 | Wohlschlegel et al. | |

FOREIGN PATENT DOCUMENTS

| | | |
|---|---|---|
| TW | I536392 | 6/2016 |
| WO | 2012120591 | 9/2012 |

\* cited by examiner

SEMICONDUCTOR MEMORY WITH DATA PROTECTION FUNCTION AND DATA PROTECTION METHOD THEREOF

BACKGROUND

Technical Field

The disclosure relates to a storage device, and particularly relates to a semiconductor memory and a data protection method.

Description of Related Art

The general NAND flash memory has the problem of power-down-disturb failure. In this regard, the problem of power-down-disturb failure may be caused by the unexpected power-down during the data programming period of the memory. Specifically, during the memory performs the data program for the current page in the memory array of the memory, if the supply voltage of the memory drops instantaneously, the data cannot be successfully written to the current page in the memory array, and the data previously recorded in the previously page or other adjacent page of the memory array may occur loss or damage. Therefore, regarding how to provide a data protection function for protecting the data previously written in the memory when the power is accidentally dropped to shut down, solutions of several embodiments are provided below.

SUMMARY

The disclosure is directed to a semiconductor memory and a data protection method, and can operate an effective data protection function.

A semiconductor memory of the disclosure includes a memory array, a switch circuit, a control circuit and a power-down monitor circuit. The switch circuit is coupled to the memory array. The control circuit is coupled to the switch circuit. The power-down monitor circuit is coupled to the control circuit and a supply voltage. The power-down monitor circuit is configured to determine whether that the supply voltage drops below a first power-down detect level during a programming period, to output a trigger signal to the control circuit. The control circuit executes a reset sequence of the semiconductor memory according to the trigger signal. The first power-down detect level is lower than a minimum value of the supply voltage recorded in a datasheet of the semiconductor memory.

A data protection method of a semiconductor memory of the disclosure includes following steps: executing, by a control circuit, an programming operation of the semiconductor memory during a programming period; determining, by a power-down monitor circuit, whether that a supply voltage drops below a first power-down detect level during the programming period; outputting, by the power-down monitor circuit, a trigger signal to the control circuit when the supply voltage drops below the first power-down detect level; executing, by the control circuit, a reset sequence of the semiconductor memory according to the trigger signal, wherein the first power-down detect level is lower than a minimum value of the supply voltage recorded in a datasheet of the semiconductor memory.

Based on the above, according to the semiconductor memory and the data protection method of the disclosure, during the programming period, the semiconductor memory is capable of automatically monitoring whether that the supply voltage unexpectedly drops below the first power-down detect level, so as to automatically execute the data protection to prevent instantaneous power failure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "electrically connected," and variations thereof herein are used broadly and encompass direct and indirect connections, couplings, and mountings.

Figure 1:
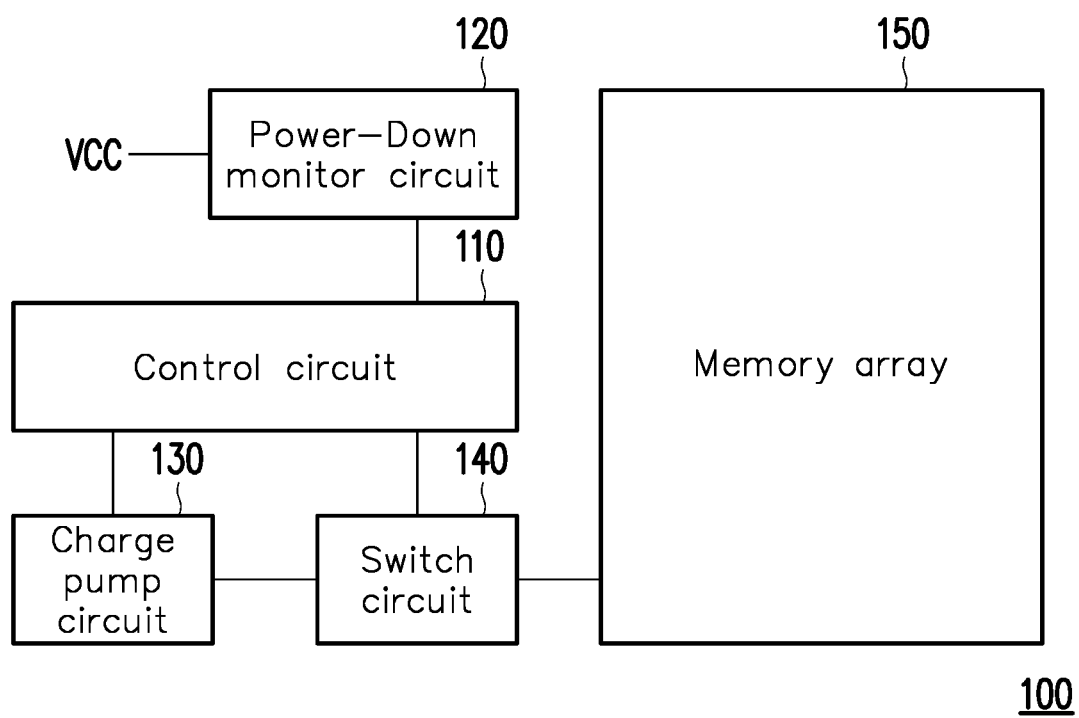
FIG. 1 is a schematic diagram illustrating a semiconductor memory according to an embodiment of the disclosure.

FIG. 1 is a schematic diagram illustrating a semiconductor memory according to an embodiment of the disclosure. Referring to FIG. 1, the semiconductor memory 100 includes a control circuit 110, a power-down monitor circuit 120, a charge pump circuit 130, a switch circuit 140 and a memory array 150. The semiconductor memory 100 may be a NAND flash memory. The control circuit 110 is coupled to the power-down monitor circuit 120, the charge pump circuit 130 and the switch circuit 140. The switch circuit 140 is coupled to the charge pump circuit 130 and the memory array 150. The control circuit 110 controls the charge pump circuit 130 and the switch circuit 140 to perform the access operation of the memory array 150. For example, the control circuit 110 may perform the programming operation or the erasing operation on the memory array 150, so as to read or write data into the memory array 150. The programming signal (programming voltage) of the programming operation and the erasing signal (erasing voltage) of erasing operation are generated by the charge pump circuit 130. In the present embodiment, the charge pump circuit 130 provides a plurality of word line voltages to the memory array 150 through the switch circuit 140 during the programming period.

In the present embodiment, the power-down monitor circuit 120 is configured to detect whether the supply voltage VCC drops unexpectedly to 0 or the voltage level at which the memory cannot operate normally during the programming period of the semiconductor memory 100, so as to automatically execute the reset sequence of the semiconductor memory 100 to prevent the data previously recorded (written) in the memory array 150. It should be noted that, in the present embodiment, the power-down monitor circuit 120 is only enabled during the programming period, but the disclosure is not limited thereto. In another embodiment, the power-down monitor circuit 120 may be enabled during the erasing period or other operating periods of the semiconductor memory 100.

Figure 2:
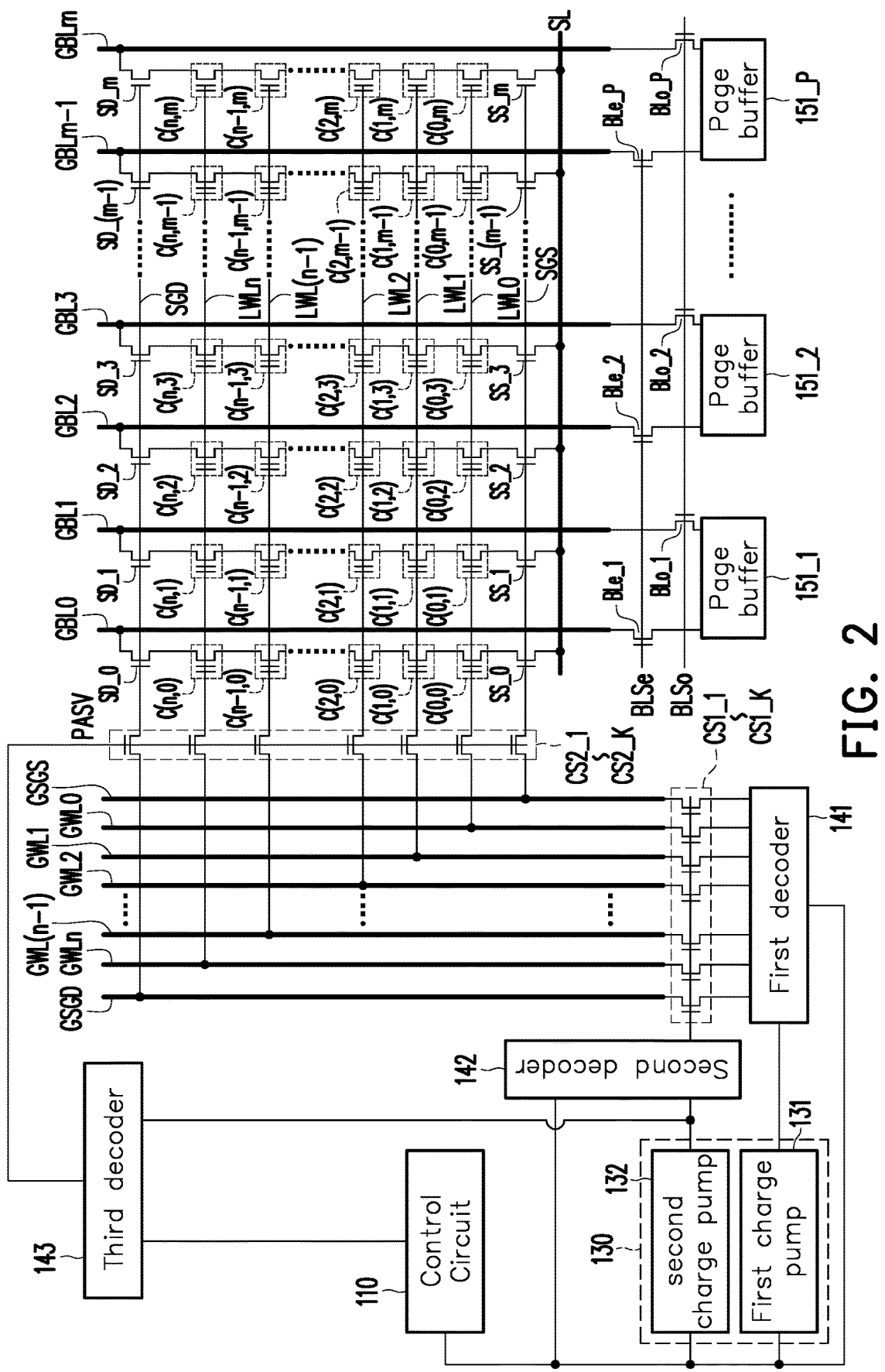
FIG. 2 is a schematic diagram illustrating a memory array and its peripheral circuits according to an embodiment of the disclosure.

FIG. 2 is a schematic diagram illustrating a memory array and its peripheral circuits according to an embodiment of the disclosure. Referring to FIG. 1 and FIG. 2, the charge pump circuit 130 includes a first charge pump 131 and a second charge pump 132. The switch circuit 140 includes a first decoder 141, a second decoder 142, a third decoder 143 and a plurality of select switches CS1_1 to CS1_K and CS2_1 to CS2_K, where K is a positive integer greater than 0. The first charge pump 131 is coupled to the control circuit 110 and first decoder 141. The second charge pump 132 is coupled to the control circuit 110, the second decoder 142 and the third decoder 143. A plurality of first terminals of the select switches CS1_1 to CS1_K are coupled to global select gate lines GSGD, GSGS and a plurality of global word lines GWL0 to GWLn, and a plurality of second terminals of the select switches CS1_1 to CS1_K are coupled to the first decoder 141. A plurality of control terminals of the select switches CS1_1 to CS1_K are coupled to the second decoder 142. The third decoder 143 is coupled between the second charge pump 132 and a plurality of control terminals of the select switches CS2_1 to CS2_K.

In the present embodiment, one of the memory regions of the memory array 150 may be as shown in FIG. 2, the one of the memory regions of the memory array 150 may include a plurality of memory cells C(0,0) to C(n,m), where n and m are positive integers greater than 0. In the present embodiment, the global select gate lines GSGD, GSGS and the global word lines GWL0 to GWLn are coupled to select gate lines SGD and SGS, and a plurality of local word lines LWL0 to LWLn through the select switches CS2_1 to CS2_K. The select gate line SGD is coupled to a plurality of control terminals of a plurality of select switches SD_0 to SD_m, and the select gate line SGS is coupled to a plurality of control terminals of a plurality of select switches SS_0 to SS_m. The local word lines LWL0 to LWLn are coupled to the memory cells C(0,0) to C(n,m). In the present embodiment, each column of the memory cells C(0,0) to C(n,m) is coupled to one of a plurality of global bit lines GBL0 to GBLm through the select switches SD_0 to SD_m, and the memory cells C(0,0) to C(n,m) are coupled to a select line SL through the select switches SS_0 to SS_m. The even global bit lines are coupled to a plurality of page buffer 151_1 to 151_P through the select switches BLe_1 to BLe_P, and the odd global bit lines are coupled to the page buffer 151_1 to 151_P through the select switches BLo_1 to BLo_P, where P is a positive integer greater than 0. Each one of the page buffer 151_1 to 151_P is coupled to one even global bit line and one odd global bit line. The select switches BLe_1 to BLe_P and the select switches BLo_1 to BLo_P are controlled by bit line select signals BLSe and BLSo.

In the programming operation of the semiconductor memory 100, the control circuit 110 may control the first charge pump 131 and the first decoder 141 to provide the programming signals (word line voltages) through the select switches CS1_1 to CS1_K, and control the second charge pump 132, the second decoder 142 and the third decoder 143 to provide a plurality of turn-on signals (control voltages) and a select signal PASV (control voltage) to selectively turn on the plurality of select switches CS1_1 to CS1_K and CS2_1 to CS2_K, so as to write the data into the plurality of memory cells C(0,0) to C(n,m). Furthermore, when the control circuit 110 performs the programming operation of a first data page, the memory cells C(0,0), C(0,2) to C(0,m−1) of the first row and even columns of the memory cells C(0,0) to C(n,m) may be written with data by corresponding programming signals. Then, when the control circuit 110 performs the programming operation of a second data page, the memory cells C(0,1), C(0,3) to C(0,m) of the first row and odd columns of the memory cells C(0,0) to C(n,m) may be written with data by corresponding programming signals. Then, when the control circuit 110 performs the programming operation of a third data page, the memory cells C(1,0), C(1,2) to C(1,m−1) of the second row and even columns of the memory cells C(0,0) to C(n,m) may be written with data by corresponding programming signals. Similarly, the control circuit 110 may sequentially and regularly write data into the different data pages of the memory cells C(0,0) to C(n,m).

However, for example, during the programming period, when the control circuit 110 performs the programming operation of the second data page, if the supply voltage VCC drops unexpectedly to 0 or the voltage level at which the memory cannot operate normally, due to the memory cells C(0,0), C(0,2) to C(0,m−1) are adjacent the memory cells C(0,1), C(0,3) to C(0,m), the unexpected power down condition of the memory cells C(0,0), C(0,2) to C(0,m−1) may affect the memory cells C(0,1), C(0,3) to C(0,m). In other words, not only the second data page has not finish programming, but also the memory cells C(0,0), C(0,2) to C(0,m−1) that has previously recorded the first data page may be damaged and lose data. Therefore, the control circuit 110 of the disclosure may perform the data protection operation of the following embodiments to effectively protect the previously written data.

Figure 3:
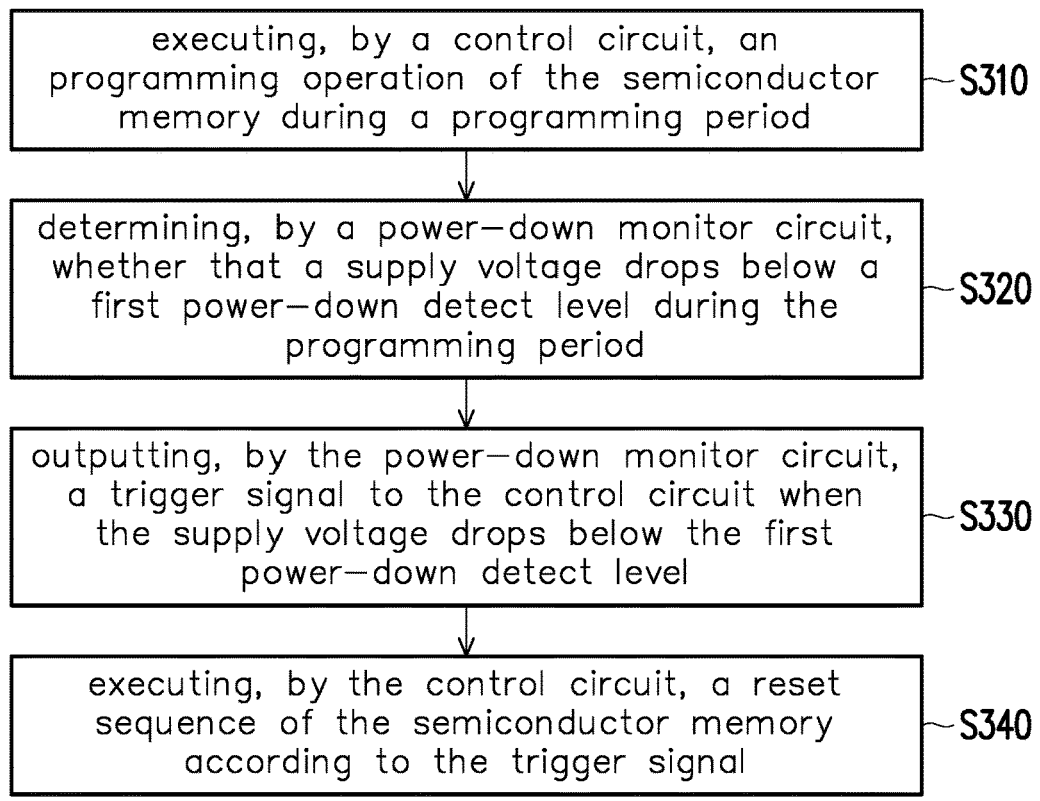
FIG. 3 is a flowchart illustrating a data protection method according to an embodiment of the disclosure.
Figure 4:
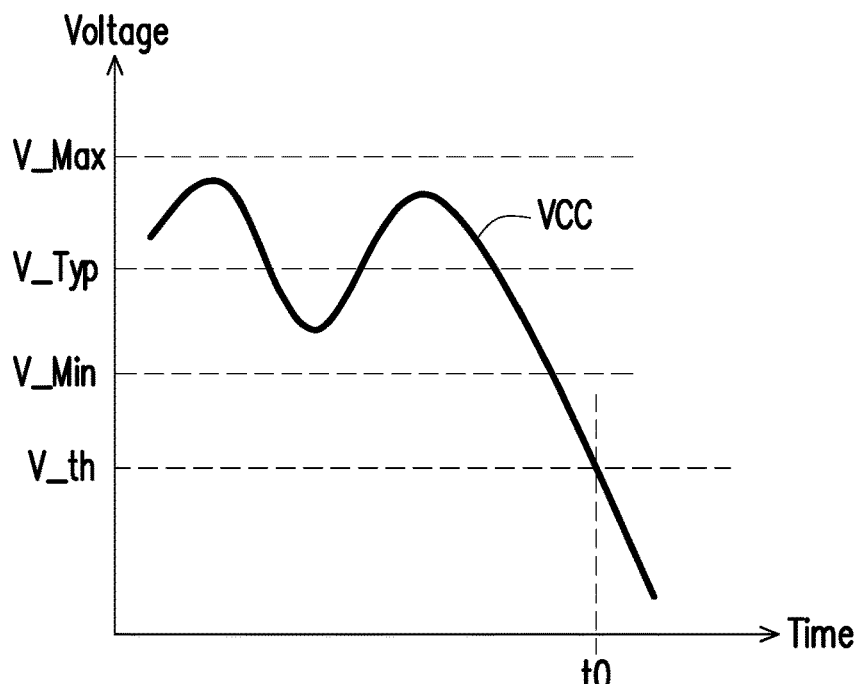
FIG. 4 is a voltage waveform diagram illustrating a supply voltage according to an embodiment of the disclosure.

FIG. 3 is a flowchart illustrating a data protection method according to an embodiment of the disclosure. FIG. 4 is a voltage waveform diagram illustrating a supply voltage according to an embodiment of the disclosure. Referring to FIG. 1, FIG. 3 and FIG. 4, the semiconductor memory 100 may perform the following steps S310 to S340 to implement the data protection function. In step S310, the control circuit 110 may execute the programming operation of the semiconductor memory 100 during the programming period. In step S320, the power-down monitor circuit 120 may determine whether that the supply voltage VCC drops below a first power-down detect level V_th during the programming period. Specifically, as shown in FIG. 4, the supply voltage VCC may have a central voltage level V_Typ and swing up and down between the maximum voltage level V_Max and the minimum voltage level V_min. The power-down monitor circuit 120 may detect whether that the supply voltage VCC drops below the first power-down detect level V_th. The minimum voltage level V_min is defined in datasheet of the semiconductor memory, and the first power-down detect level V_th is lower than the level V_min of the supply voltage VCC. In step S330, the power-down monitor circuit 120 may output the trigger signal to the control circuit 110 when the supply voltage drops below the first power-down detect level V_th. In step S340, the control circuit 110 executes the reset sequence of the semiconductor memory 100 according to the trigger signal.

In the present embodiment, at time t0, the reset sequence may include that the control circuit 110 controls the charge pump circuit 130 to stop providing the word line voltages to the word lines. As shown in FIG. 2, the first charge pump 131 stops providing the word line voltages to the global word lines GWL0 to GWLn, but the second charge pump 132 may continuously provide the control voltage to the control terminals of the select switches CS1_1 to CS1_K and CS2_1 to CS2_K. Thus, the select switches CS1_1 to CS1_K and CS2_1 to CS2_K are controlled to maintain operating in the turn-on state, so that the remaining voltage on the global word lines GWL0 to GWLn can be effectively released (discharge). However, in another embodiment, when the first charge pump 131 stops providing the word line voltages to the global word lines GWL0 to GWLn, the second charge pump 132 may also synchronously stop providing the control voltage to the control terminals of the select switches CS1_1 to CS1_K and CS2_1 to CS2_K, so as to synchronously turn-off the select switches CS1_1 to CS1_K and CS2_1 to CS2_K. In yet another embodiment, when the first charge pump 131 stops providing the word line voltages to the global word lines GWL0 to GWLn, the second charge pump 132 may stop providing the control voltage to the control terminals of the select switches CS1_1 to CS1_K and CS2_1 to CS2_K when the supply voltage drops below a second power-down detect level, so as to turn-off the select switches CS1_1 to CS1_K and CS2_1 to CS2_K, where the second power-down detect level is lower than the first power-down detect level V_th. Therefore, the influence of the abnormal voltage change VCC on the data that has been previously recorded in part of the memory cells of the memory array 150 may be reduced or avoided. In addition, the reset sequence may further include that the control circuit 110 executes a default reset command (for example, the FFh RESET command) of the semiconductor memory 100, so as to perform reset operation of the semiconductor memory 100.

Figure 5:
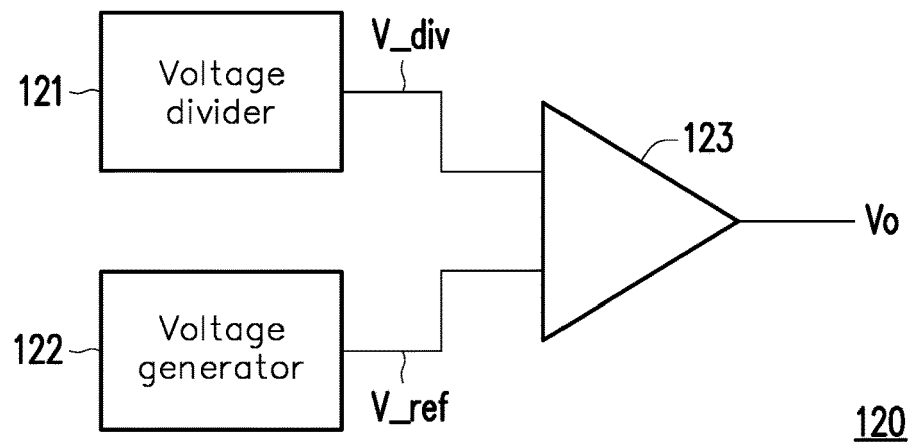
FIG. 5 is a schematic diagram illustrating a power-down monitor circuit according to an embodiment of the disclosure.
Figure 6:
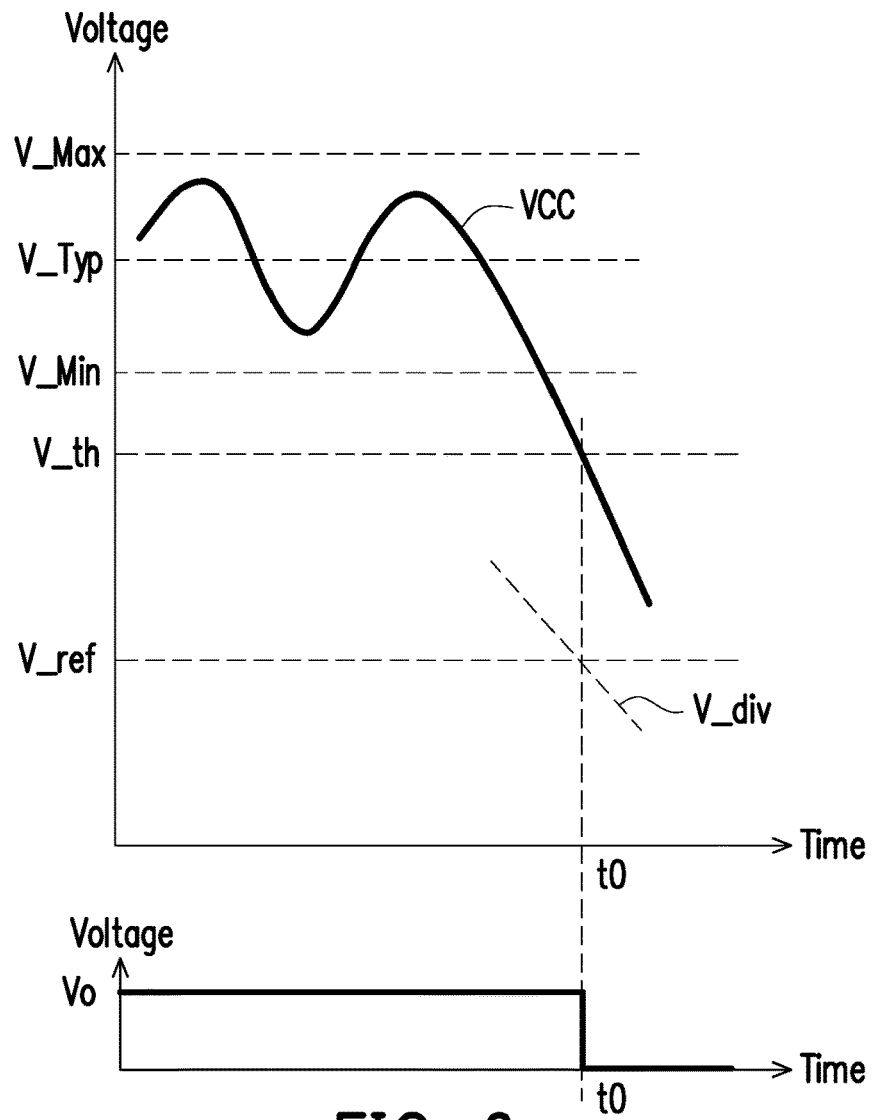
FIG. 6 is a voltage relationship diagram illustrating a supply voltage and an output voltage according to another embodiment of the disclosure.

FIG. 5 is a schematic diagram illustrating a power-down monitor circuit according to an embodiment of the disclosure. FIG. 6 is a voltage relationship diagram illustrating a supply voltage and an output voltage according to another embodiment of the disclosure. Referring to FIG. 5 and FIG. 6, the power-down monitor circuit 120 includes a voltage divider 121, a voltage generator 122 and a comparator 123. The voltage divider 121 is coupled to the supply voltage VCC, and configured to output a divided voltage V_div according to the supply voltage VCC. The voltage divider 121 may be composed of multiple voltage divider resistors, but the disclosure is not limited thereto. The voltage generator 122 is configured to output a reference voltage V_ref according to the first power-down detect level V_th. The comparator 123 is coupled to the voltage divider 121 and the voltage generator 122 by a first input terminal and a second input terminal of the comparator 123. The comparator 123 is configured to output an output signal Vo for generating the trigger signal to the control circuit 110 by the output terminal of the comparator 123. As shown in FIG. 6, the reference voltage V_ref may be designed by according to the first power-down detect level V_th. In the present embodiment, when the divided voltage V_div and the reference voltage V_ref cross, the output signal Vo of the comparator 123 may change to the low voltage level from the high voltage level. Therefore, the power-down monitor circuit 120 may correspondingly generate the trigger signal to the control circuit 110 according to the voltage change of the output signal Vo.

Figure 7:
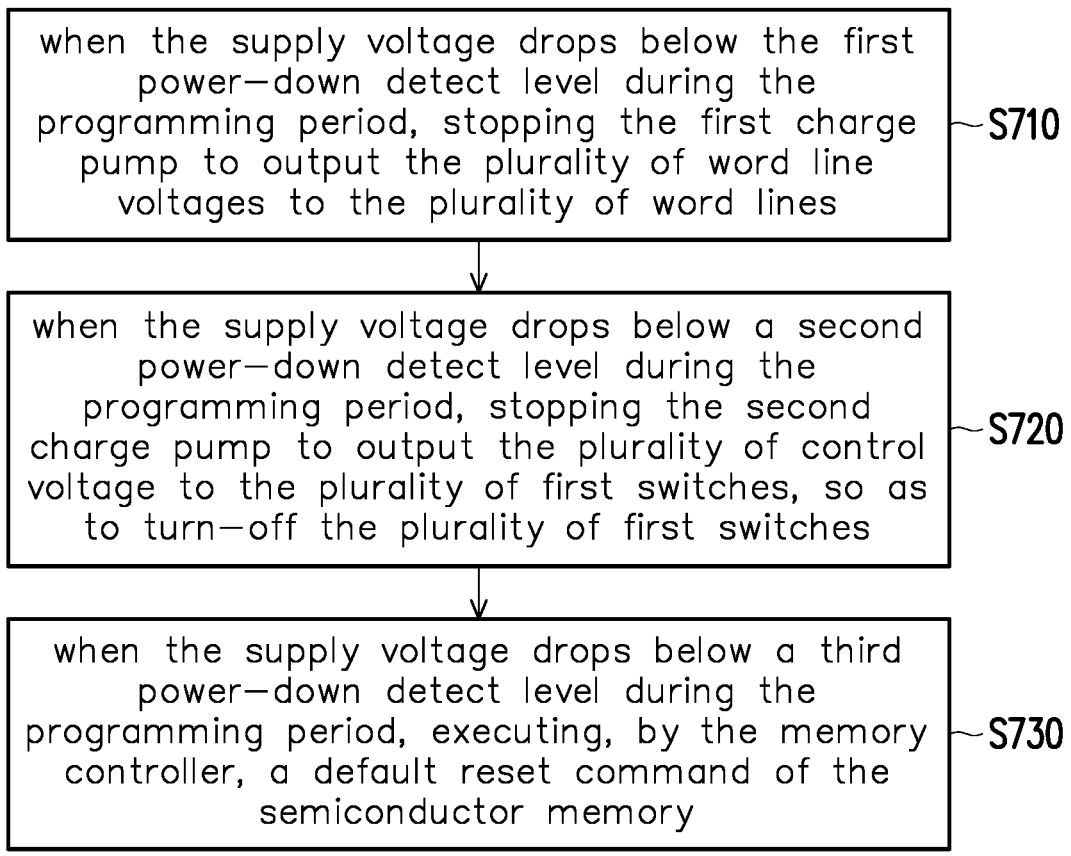
FIG. 7 is a flowchart illustrating a reset sequence according to an embodiment of the disclosure.

FIG. 7 is a flowchart illustrating a reset sequence according to an embodiment of the disclosure. It should be noted that, based on the design conception of the power-down monitor circuit 120 of FIG. 5, the power-down monitor circuit 120 of FIG. 1 may further include more above related circuits to set a second power-down detect level and a third power-down detect level, and the second power-down detection level and the third power-down detection level can be used for data protection operations at the above different stages in the reset sequence. Thus, referring to FIG. 1, FIG. 2 and FIG. 7, the control circuit 110 may execute the reset sequence has different stages as following steps S710 to S730. In step S710, when the supply voltage VCC drops below the first power-down detect level during the programming period, the control circuit 110 may stop the first charge pump 131 to output the plurality of word line voltages to the plurality of word lines. In step S720, when the supply voltage VCC drops below a second power-down detect level during the programming period, the control circuit 110 may further stop the second charge pump 132 to output the plurality of control voltage to the plurality of first switches, so as to turn-off the plurality of select switches CS1_1 to CS1_K. In step S730, when the supply voltage VCC drops below a third power-down detect level during the programming period, the control circuit 110 may execute the default reset command (for example, the FFh RESET command) of the semiconductor memory 100. The third power-down detect level is lower than the second power-down detect level, and the second power-down detect level is lower than the third power-down detect level.

That is, in the present embodiment, the control circuit 110 may first stop providing the word line voltages to the word lines, and then may turn-off the select switches CS1_1 to CS1_K after a period of time interval. Thus, the remaining voltage on the global word lines GWL0 to GWLn can be effectively released (discharge). Finally, the control circuit 110 may execute the default reset command of the semiconductor memory 100. Therefore, the semiconductor memory 100 performing the above steps S710 to S730 is capable of protecting the data previously recorded (written) in the memory array 150 may be effectively protected.

In summary, the semiconductor memory and the data protection method of the disclosure may additional design the power-down monitor circuit to automatically detect the supply voltage during the programming period of the semiconductor memory, and utilize one or more above data protect operations of the reset sequence to protect the data previously recorded (written) in the memory array. Therefore, the semiconductor memory and the data protection method of the disclosure are capable of effectively protecting the data previously recorded (written) in the memory array when the supply voltage unexpectedly drops to cause the semiconductor memory cannot operate normally during the programming period of the semiconductor memory.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A semiconductor memory, comprising:
   a memory array;
   a switch circuit, coupled to the memory array;

a control circuit, coupled to the switch circuit; and
a power-down monitor circuit, coupled to the control circuit and a supply voltage,
wherein the power-down monitor circuit is configured to determine whether that the supply voltage drops below a first power-down detect level during a programming period, to output a trigger signal to the control circuit, and the control circuit executes a reset sequence of the semiconductor memory according to the trigger signal, wherein the first power-down detect level is lower than a minimum value of the supply voltage recorded in a datasheet of the semiconductor memory.

2. The semiconductor memory according to the claim 1, wherein the power-down monitor circuit is only enabled during the programming period.

3. The semiconductor memory according to the claim 1, wherein the reset sequence comprises that the control circuit executes a default reset command of the semiconductor memory.

4. The semiconductor memory according to the claim 1, further comprising:
a charge pump circuit, coupled to the switch circuit and the control circuit,
wherein the charge pump circuit is configured to provide a plurality of word line voltages to the memory array through the switch circuit during the programming period, and the reset sequence comprises that the control circuit controls the charge pump circuit to stop providing the plurality of word line voltages.

5. The semiconductor memory according to the claim 4, wherein the charge pump circuit comprises a first charge pump, and the first charge pump is coupled to a plurality of word lines through a plurality of select switches of the switch circuit, and the first charge pump is configured to output the plurality of word line voltages to the plurality of word lines during the programming period,
wherein when the supply voltage drops below the first power-down detect level during the programming period, the first charge pump stops outputting the plurality of word line voltages to the plurality of word lines.

6. The semiconductor memory according to the claim 5, wherein, during the programming period in which the supply voltage drops below the first power-down detect level, the plurality of select switches are controlled to maintain operating in a turn-on state.

7. The semiconductor memory according to the claim 5, wherein the charge pump circuit further comprises a second charge pump, the second charge pump is coupled to control terminals of the plurality of select switches, and the second charge pump is configured to output a plurality of control voltage to the control terminals of the plurality of select switches during the programming period,
wherein when the supply voltage drops below a second power-down detect level during the programming period, the second charge pump stops outputting the plurality of control voltage to the plurality of select switches, so as to turn-off the plurality of select switches.

8. The semiconductor memory according to the claim 7, wherein the second power-down detect level is lower than the first power-down detect level.

9. The semiconductor memory according to the claim 8, wherein the reset sequence further comprises that when the power-down monitor circuit determines that the supply voltage drops below a third power-down detect level during the programming period, the control circuit executes a default reset command of the semiconductor memory,
wherein the third power-down detect level 1 is lower than the second power-down detect level.

10. The semiconductor memory according to the claim 1, wherein the power-down monitor circuit comprises:
a voltage divider, coupled to the supply voltage, and configured to output a divided voltage according to the supply voltage;
a voltage generator, configured to output a reference voltage according to the first power-down detect level; and
a comparator, coupled to the voltage divider and the voltage generator by a first input terminal and a second input terminal, and configured to output an output signal for generating the trigger signal to the control circuit by an output terminal.

11. A data protection method of a semiconductor memory, comprising:
executing, by a control circuit, a programming operation of the semiconductor memory during a programming period;
determining, by a power-down monitor circuit, whether that a supply voltage drops below a first power-down detect level during the programming period;
outputting, by the power-down monitor circuit, a trigger signal to the control circuit when the supply voltage drops below the first power-down detect level;
executing, by the control circuit, a reset sequence of the semiconductor memory according to the trigger signal, wherein the first power-down detect level is lower than a minimum value of the supply voltage recorded in a datasheet of the control circuit.

12. The data protection method according to the claim 11, wherein the power-down monitor circuit is only enabled during the programming period.

13. The data protection method according to the claim 11, wherein the reset sequence comprises:
executing, by the control circuit, a default reset command of the semiconductor memory.

14. The data protection method according to the claim 11, wherein the programming operation comprises:
providing, by a charge pump circuit, a plurality of word line voltages to the memory array through a switch circuit during the programming period; and
wherein the reset sequence comprises:
controlling, by the control circuit, the charge pump circuit to stop providing the plurality of word line voltages.

15. The data protection method according to the claim 14, wherein the step of providing, by the charge pump circuit, the plurality of word line voltages to the memory array through the switch circuit during the programming period comprises:
outputting, by a first charge pump of the charge pump circuit, the plurality of word line voltages to a plurality of word lines during the programming period; and
wherein the step of controlling, by the control circuit, the charge pump circuit to stop providing the plurality of word line voltages comprises:
when the supply voltage drops below the first power-down detect level during the programming period, stopping the first charge pump to output the plurality of word line voltages to the plurality of word lines.

16. The data protection method according to the claim 15, wherein the step of controlling, by the control circuit, the charge pump circuit to stop providing the plurality of word line voltages further comprises:

controlling the plurality of select switches of the switch circuit to maintain operating in a turn-on state.

17. The data protection method according to the claim 16, wherein the step of providing, by the charge pump circuit, the plurality of word line voltages to the memory array through the switch circuit during the programming period further comprises:
  outputting, by a second charge pump of the charge pump circuit, a plurality of control voltage to control terminals of the plurality of select switches during the programming period; and
  wherein the reset sequence further comprises:
  when the supply voltage drops below a second power-down detect level during the programming period, stopping the second charge pump to output the plurality of control voltage to the plurality of select switches, so as to turn-off the plurality of select switches.

18. The data protection method according to the claim 17, wherein the second power-down detect level is lower than the first power-down detect level.

19. The data protection method according to the claim 18, the reset sequence further comprises:
  when the supply voltage drops below a third power-down detect level during the programming period, executing, by the control circuit, a default reset command of the semiconductor memory,
  wherein the third power-down detect level l is lower than the second power-down detect level.

20. The data protection method according to the claim 11, the step of outputting, by the power-down monitor circuit, the trigger signal to the control circuit when the supply voltage drops below the first power-down detect level comprises:
  outputting, by a voltage divider, a divided voltage according to the supply voltage;
  outputting, by a voltage generator, a reference voltage according to the first power-down detect level; and
  outputting, by an output terminal of a comparator, an output signal for generating the trigger signal to the control circuit according to the divided voltage and the reference voltage received by a first input terminal and a second input terminal of the comparator.

* * * * *